United States Patent [19]
Lim et al.

[11] Patent Number: 5,757,837
[45] Date of Patent: May 26, 1998

[54] INTRACAVITY QUANTUM WELL PHOTODETECTOR INTEGRATED WITHIN A VERTICAL-CAVITY SURFACE-EMITTING LASER AND METHOD OF OPERATING SAME

[75] Inventors: Sui F. Lim, Sacramento; Connie J. Chang-Hasnain, Palo Alto, both of Calif.

[73] Assignee: The Regents of the University of California, Oakland, Calif.

[21] Appl. No.: 731,527

[22] Filed: Oct. 16, 1996

[51] Int. Cl.$^6$ ................................................ H01S 3/19
[52] U.S. Cl. .................. 372/50; 372/43; 372/44; 372/45; 372/46; 372/98; 372/99
[58] Field of Search ................. 372/12, 43, 44, 372/45, 46, 50, 75, 96, 98, 99, 108; 257/80, 86, 14

[56] References Cited

U.S. PATENT DOCUMENTS

| | | | |
|---|---|---|---|
| 5,056,098 | 10/1991 | Anthony et al. | 372/45 |
| 5,136,603 | 8/1992 | Hasnain et al. | 372/50 |
| 5,206,872 | 4/1993 | Jewell et al. | 372/46 |
| 5,216,686 | 6/1993 | Holm et al. | 372/45 |
| 5,285,466 | 2/1994 | Tabatabaie | 372/50 |
| 5,341,390 | 8/1994 | Yamada et al. | 372/45 |
| 5,408,486 | 4/1995 | Shoji | 372/45 |
| 5,424,559 | 6/1995 | Kasahara | 257/21 |
| 5,475,701 | 12/1995 | Hibbs-Brenner | 372/50 |
| 5,491,712 | 2/1996 | Lin et al. | 372/50 |
| 5,577,064 | 11/1996 | Swirhun et al. | 372/96 |

OTHER PUBLICATIONS

Hasnain et al., "Monolithic Integration of Photodetector with Vertical Cavity Surface Emitting Laser", *Electronics Letters* 27(18):1630–1632 (1991).

Lott et al., "Deep Red Vertical Cavity Surface Emitting Lasers with Monolithically Integrated Heterojunction Phototransistors for Output Power Control", Proceedings of the International Semi–Conductor Laser Conference, Haifa, Israel, Oct. 14, 1996, pp. 185–186.

Shin et al., "Vertical–Cavity Surface–Emitting Lasers for Optical Data Storage", *Japanese Journal of Applied Physics* 35(1B):506–507, part 1 (1996).

Wang et al., "Molecular Beam Epitaxy Growth of AlGaAs/GaAs Vertical Cavity Surface Emitting Lasers and the Performance of PIN Photodetector/Vertical Cavity Surface Emitting Laser Integrated Structures", *Japanese Journal of Applied Physics* 30(12B):3883–3886 (1991).

*Primary Examiner*—Brian Healy
*Attorney, Agent, or Firm*—Flehr Hohbach Test Albritton & Herbert LLP; William S. Galliani

[57] ABSTRACT

A vertical-cavity surface emitting laser is constructed with an intracavity quantum well photodetector. The quantum well photodetector is placed at an optical intensity peak at the Fabry-Perot wavelength. The device may include a current confinement layer in the form of an oxidation layer, an air gap, or proton implantation. The device may be formed with a semi-insulating substrate, a p+ doped substrate, or an n+ doped substrate. Embodiments of the invention include an air bridge contact, a ridge waveguide structure, and buried heterostructure layers.

23 Claims, 15 Drawing Sheets

INTRACAVITY QUANTUM WELL PHOTODETECTOR INTEGRATED WITHIN A VERTICAL-CAVITY SURFACE-EMITTING LASER AND METHOD OF OPERATING SAME

BRIEF DESCRIPTION OF THE INVENTION

This invention relates generally to lasers. More particularly, this invention relates to a vertical-cavity surface-emitting laser with an intracavity quantum well photodetector.

This invention was made with Government support under Grant (Contract) No. F49620-94-C-0038 awarded by the Joint Services Electronic Program (JSEP). The Government has certain rights to this invention.

BACKGROUND OF THE INVENTION

Vertical-cavity surface-emitting lasers (VCSELs) are used as light sources in a variety of electronic applications including fiber optic communications, laser printing, and optical data storage. A VCSEL is an injection diode laser where the laser oscillation and output occur normal to a semiconductor pn junction plane. In edge-emitting laser diodes, the laser oscillation and output occur in the semiconductor pn junction plane. VCSELs have many advantages compared with edge-emitting laser diodes. These advantages include a low divergence circular output, single longitudinal mode operation, and high two-dimensional packing density.

All lasers use the principle of amplification of electromagnetic waves by stimulated emission of radiation. The term laser is an acronym for light amplification by stimulated emission of radiation.

The process of stimulated emission can be described as follows. When atoms, ions, or molecules absorb energy, they can emit light spontaneously (as in an incandescent lamp) or they can be stimulated to emit by a light wave. If a collection of atoms is pumped so that more are initially excited than unexcited, then an incident light wave will stimulate more emission than absorption, and there is net amplification of the incident light beam. This is the way a laser amplifier works.

A laser amplifier can be made into a laser oscillator by arranging suitable mirrors on either end of the amplifier to form a resonator. Thus, the essential parts of a laser oscillator are an amplifying medium, a source of pump power, and a resonator. Radiation that is directed straight along the axis bounces back and forth between the mirrors and can remain in the resonator long enough to build up a strong oscillation. Radiation may be coupled by making one mirror partially transparent so that part of the amplified light can emerge through it.

The fundamental light-producing mechanism in an injection diode laser, such as a VCSEL, is the recombination of excess conduction-band electrons and valence-band holes. This recombination operation takes place by pumping excess carriers across a junction. That is, excess electrons are injected from a semiconductor n-layer and excess holes from a semiconductor p-layer into an active waveguide region, where they recombine, via stimulated emission, producing the desired gain. The lasing threshold is reached when optical loss is balanced by optical gain.

Many applications of semiconductor lasers require dynamic stabilization of the light output against variations in the external environment. It is also necessary to monitor long-term drift in the laser and its drive circuitry. In most commercially available diode lasers, this is done by using a discrete external monitoring photodiode chip. The photocurrent generated by the external detector is used in a feedback circuit to adjust the laser injection current.

Recently, it has been proposed to substitute discrete external monitoring photodiode chips with monolithic photodiodes for the use with VCSELs. In these schemes, photodiodes are placed either on the top, on the bottom, on the side, or along the perimeter of the VCSEL. In this location, the photodiode directly intercepts and samples the laser emission as it exits the device.

While the monolithic approach avoids many of the problems associated with the use of a separate monitoring photodiode chip, its performance is far from ideal. The primary problem with these devices is that they detect too much spontaneous emission. In addition, they are susceptible to ambient light. Consequently, the performance of the proposed monolithic photodiodes is inferior to that of a separate monitoring photodiode chip. Thus, it would be highly desirable to develop an improved monolithic photodetector for use in VCSELs.

SUMMARY OF THE INVENTION

The invention is an intracavity quantum well photodetector integrated into a vertical-cavity surface emitting laser. The quantum well photodetector is placed at an optical intensity peak at the Fabry-Perot wavelength. The device may include a current confinement layer implemented as an oxidation layer, an air gap, or through proton implantation. The device may be formed with a semi-insulating substrate, a p+ doped substrate, or an n+ doped substrate. Embodiments of the invention may include an air bridge contact, a ridge waveguide structure, and buried heterostructure layers.

A primary benefit of the invention is that the photodetector detects virtually no spontaneous emission. This is important since it is desirable to modulate near threshold, and the spontaneous emission would decrease the on-off ratio necessary for a clean signal. Also, the minimal detection of spontaneous emission leads to a very clear output light-current (L-I) curve necessary for determining the threshold current with accuracy. Prior art devices commonly correct their L-I curves by subtracting the spontaneous emission.

The invention avoids bulky external detectors and accompanying optics. The embedded nature of the quantum-well photodetector renders the photodetector highly insensitive to ambient light. This is in contrast to existing monolithic devices with top or bottom mounted photodetectors. The quantum well, with its embedded position, prevents stray light from interfering with the power detection and monitoring, while its thin absorption region minimizes dark current.

The invention uses a quantum well as the detecting or absorbing medium, instead of a bulk material. In addition, the quantum well is positioned at a peak of the intensity distribution inside the lasing cavity so that it can sample a large quantity of laser light and hence be highly responsive. The invention also exploits that fact that the quantum well is resonant at the Fabry-Perot wavelength of the VCSEL.

The intracavity resonant quantum well photodetector of the invention achieves very high effective responsivity, on the order of 1/W (Ampere/Watt). Ordinary external silicon photodetectors have about 0.6 A/W responsivity.

BRIEF DESCRIPTION OF THE INVENTION

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
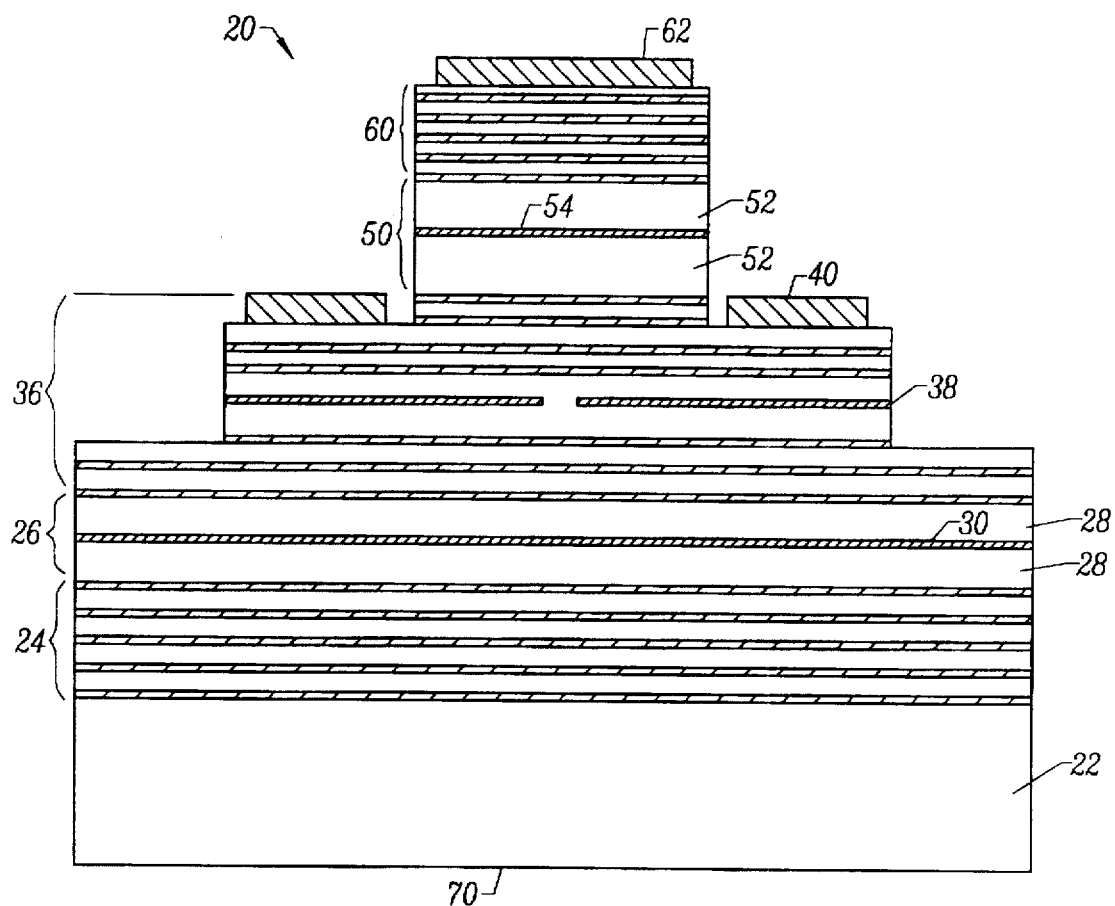
FIG. 1 is a cross-sectional view of an injection diode laser constructed in accordance with an embodiment of the invention.

FIG. 1 illustrates an intracavity quantum well photodetector integrated within a vertical-cavity surface emitting laser 20 in accordance with an embodiment of the invention. In one embodiment of the invention, the apparatus 20 includes an n+ doped GaAs substrate 22. Grown on the substrate 22 is an n-doped distributed Bragg reflector (DBR) mirror stack 24. DBR mirror stacks are known in the art. In particular, the optimization of such a structure for a particular application is known in the art. An active gain region 26 is constructed on top of the n-doped DBR mirror stack 24. The active gain region 26 includes a one-wavelength spacer 28 with a quantum well stack 30 positioned therein. The quantum well stack 30 includes two 80-Angstrom thick $In_{0.2}Ga_{0.8}As$ quantum wells.

A p-doped DBR mirror stack 36 is positioned on top of the active gain region 26. A current confinement layer 38 is formed within the stack 36. The current confinement layer 38 is 3 DBR pairs away from the active region 26. The current confinement layer 38 may be in the form of a ¾λ-thick AlAs (aluminum arsenide) oxidation layer. An oxidation layer of $Al_xGa_{1-x}As$, where x is approximately one, may also be used. In the alternative, an air gap may be used. The air gap may be formed by etching a sacrificial layer. Thereafter, regrowth may be executed or an air bridge may be constructed. Proton implantation by shadow masking or a similar technique may also be used to form a current confinement layer. An annular contact 40 is formed on the p-doped DBR mirror stack 36.

An intracavity quantum well photodetector 50 is then formed on the p-doped DBR mirror stack 36. The intracavity quantum well photodetector 50 includes a 5λ/4 spacer 52 with one 80-Å $In_{0.2}Ga_{0.8}As$ (indium gallium arsenide) quantum well 54 formed therein as the detector.

An n-doped DBR mirror stack 60 is then grown on top of the intracavity quantum well photodetector 50. An n-contact 62 is deposited on top of the device 20. The p-contact 40 is deposited after etching down to the p+ doped layers of the p-doped DBR mirror stack 36. The p-contact 40 is used to forward bias the active region 32, while the n-contact 62 is used to control the voltage across the quantum-well detector 50. Further, contacts 62 and 40 are used to bias the detector. The laser is biased using contact 40 and the substrate 22.

In the embodiment of FIG. 1, light comes out of the bottom surface 70 of the substrate 22. Thus, it is referred to as a bottom-emitting device. The device can also be designed to have light come out of the top surface. A top-emitting device may be constructed with an annular N-contact which allows light to escape through its aperture. A different configuration of DBR pairs is used in a top-emitting device. In sum, FIG. 1 illustrates an embodiment of the invention wherein an n-p-n VCSEL device 20 is defined. In general, the device operates in a manner that is consistent with existing VCSEL devices. That is, excess charge carriers are injected from the n-layer and p-layer regions of the device into the active region 26. The lasing threshold is reached when the optical loss is balanced by the optical gain. In prior art devices, this operation is monitored by a discrete external photodetector or a photodetector constructed on the top or bottom of the VCSEL. However, in accordance with the invention, the device is operated in conjunction with the intracavity quantum well photodetector 50. That is, the intracavity quantum well photodetector 50 of the invention provides an improved photocurrent for use in a standard feedback circuit which is used to adjust the laser injection current in a standard manner. Naturally, the improved photocurrent signal can be used for other purposes as well. Particular benefits of this intracavity quantum well photodetector 50 are discussed below. Attention presently turns to a discussion of processing steps that may be used to construct the device of the invention.

The apparatus of FIG. 1 may be constructed in any number of ways. One advantage of the invention is that its processing steps are consistent and compatible with well known processing steps. The following processing steps may be used in accordance with one embodiment of the invention.

Figure 2:
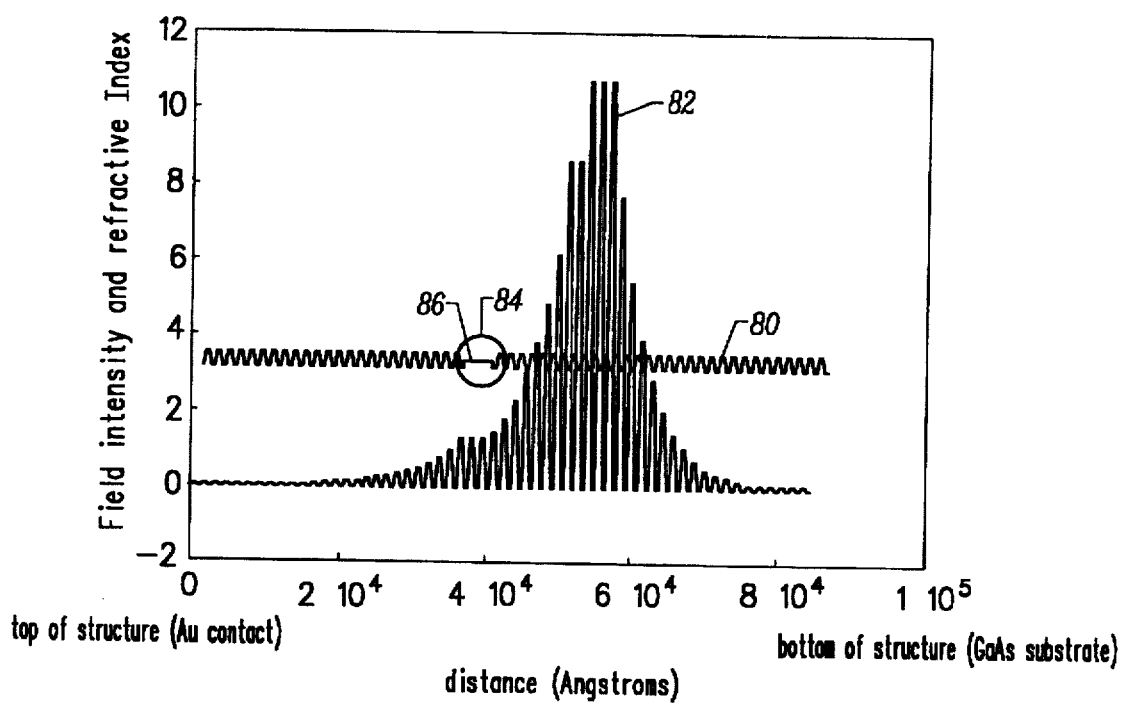
FIG. 2 illustrates the intensity-field distribution within the resonating cavity of a bottom-emitting device in accordance with an embodiment of the invention.

A wafer is grown on a GaAs substrate via molecular beam epitaxy with a refractive index profile as shown in FIG. 2. Waveform 82 of FIG. 2 illustrates the intensity-field distribution within the resonant cavity defined by the DBR stacks 24 and 36. The peaks of the intensity-field distribution overlap with the quantum wells. The discontinuity of waveform 80 shown within the circled region 84 corresponds to the spacer of the quantum well detector 50. The peak 86 corresponds to the quantum well 54.

The wafer is then diced into smaller units for ease of processing. A layer of AlAs is then oxidized to provide a current confinement layer. This is done by patterning the sample by standard photolithography to produce 90-micron circles of photoresist. The sample is then etched with a 1:8:40 sulfuric acid:hydrogen peroxide:deionized water solution until the AlAs layer is exposed. The photoresist is then washed off, using acetone followed by methanol. The sample is then placed in an oxidation furnace (flowing water vapor at approximately 425 degrees Celsius) until the desired aperture is achieved. The oxidation time usually needs to be calibrated first. The desired aperture is around 10 microns in diameter.

Next, the n-contact 62 is deposited. This may be done by patterning the sample using standard photolithography to produce approximately 20-micron circles of photoresist centered over the 90-micron etched circles. Evaporation of 150 Angstroms of nickel, 350 Angstroms of germanium, 500 Angstroms of gold, 350 Angstroms of nickel, and finally 1500 Angstroms of gold is then performed. The photoresist is then stripped, using acetone followed by methanol.

The p-contact 40 is then formed. This may be done by patterning the sample using standard photolithography to produce approximately 34-micron diameter circles of centered photoresist. The sample is then etched in 1:8:40 sulfuric acid:hydrogen peroxide:deionized water until the p+ doped layers are reached. The sample is then dipped in 10:1 buffered oxide etch or 1:40 hydrofluoric acid:deionized water to clean off any AlGaAs oxides. The photoresist is then washed off. The sample is then patterned by standard photolithography to produce annular dark-field rings (centered) about 70 microns in diameter and 16 microns in annulus width. Approximately 200 Angstroms of titanium and 2000 Angstroms of gold are then evaporated. Finally, the photoresist is washed off.

Figure 3:
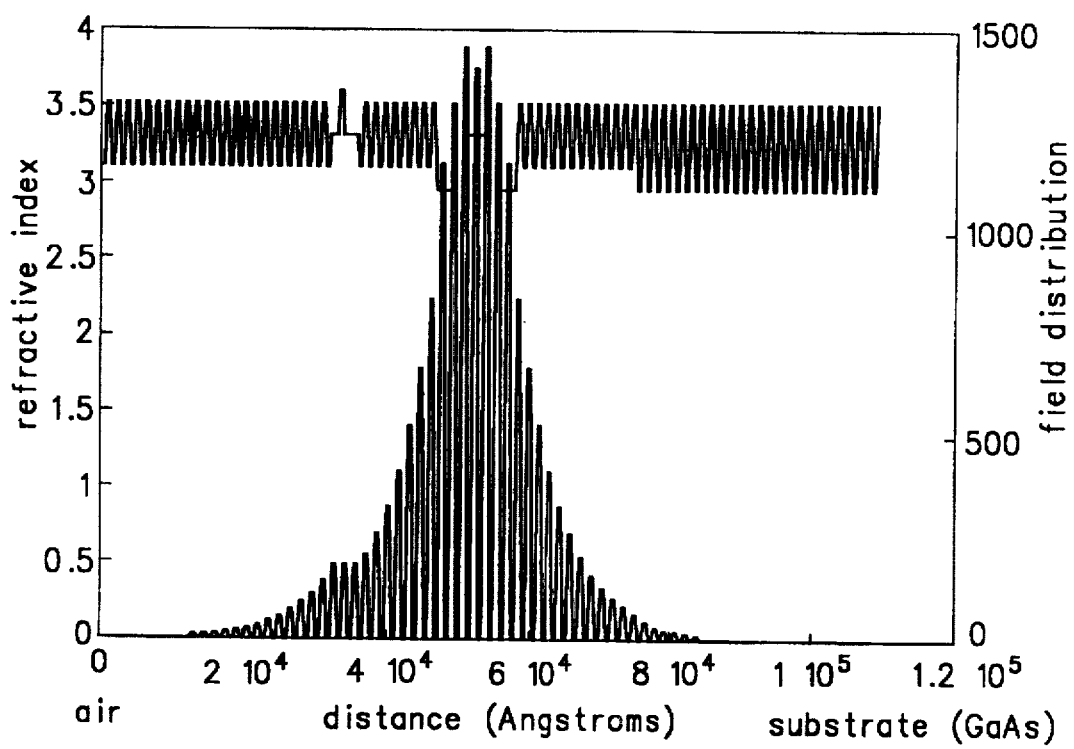
FIG. 3 illustrates the intensity-field distribution within the resonating cavity of a top-emitting device in accordance with an embodiment of the invention.

Similar steps are performed for a top-emitting VCSEL with an intracavity quantum-well photodetector. The n-contact is evaporated first followed by the p-contact. Then, the two metal contacts are annealed in a rapid thermal annealer to improve the conductivity. Finally, the sample is etched down and oxidized. The intensity-field distribution within the cavity of a top-emitting device is shown in FIG. 3.

Figure 4:
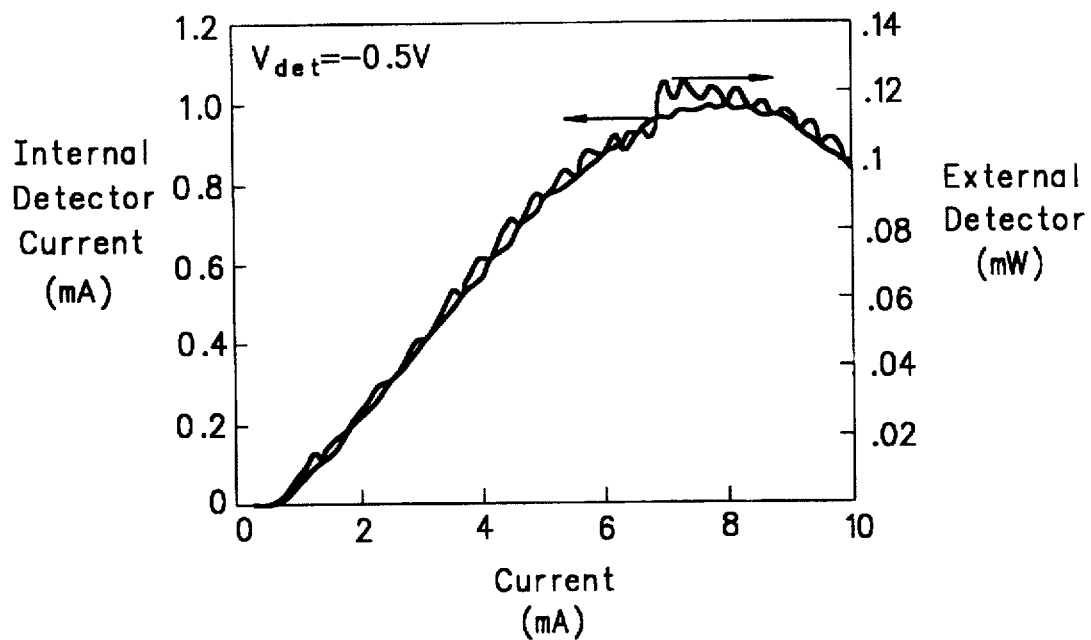
FIG. 4 illustrates light-current (L-I) characteristics of bottom-emitting devices in accordance with the invention.

The operation of the invention and its advantages are more fully appreciated with reference to the following figures. FIG. 4 illustrates the Light-Current (L-I) characteristics of a bottom-emitting device in accordance with the invention. This figure compares the internal photodetector current and the external photodetector current (calibrated to milliwatts of output power). The two L-I curves match very closely. Virtually no spontaneous emission (incoherent random fluctuations of light that is emitted, most evident below the lasing threshold) is detected. However, because it is a bottom-emitting laser, the backside reflections off the substrate interface causes ripples in the output power, as evident in the external detector trace. The ripples can be eliminated with the use of an anti-reflection coating. $V_{det}$ is the reverse bias voltage applied to the internal photodetector.

Figure 5:
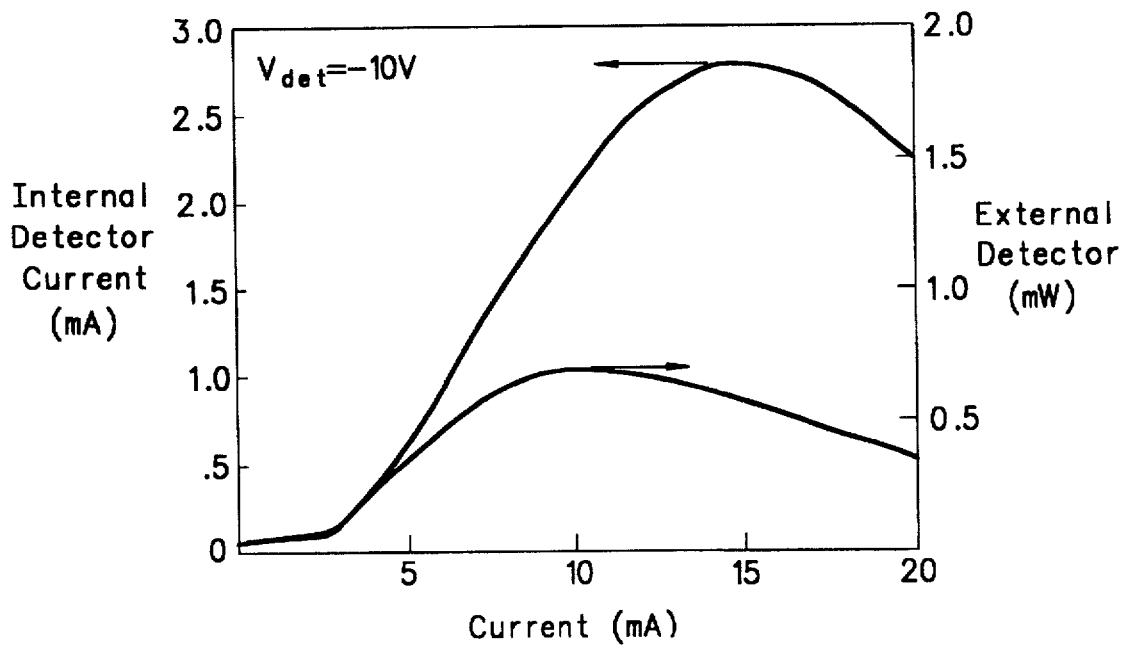
FIG. 5 illustrates light-current (L-I) characteristics of top-emitting devices in accordance with the invention.

FIG. 5 illustrates the Light-Current (L-I) Characteristics of top-emitting devices. This graph compares the internal photodetector current and the external photodetector current. The effective detectivity (or responsivity) is 1.2A/W. Again, virtually no spontaneous emission is detected by the internal detector. The L-I curves do not match as closely as in the case of the bottom-emitting device.

Figure 6:
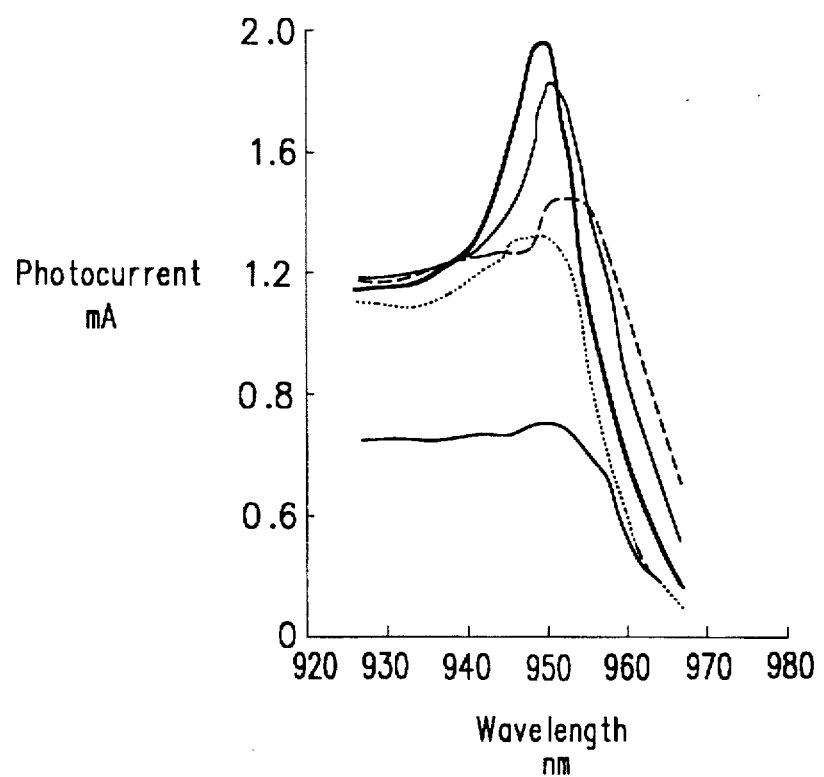
FIG. 6 illustrates light-current (L-I) mismatch due to lasing wavelength red-shifting through the detector quantum well excitonic peak.

FIG. 6 is an illustration from M. K. Chin, et al., published in Electronic Letters, 1991, 27(25), p. 2310–2312. The figure illustrates that for a top-emitting device, the L-I mismatch is due to the lasing wavelength, determined by the VCSEL Fabry-Perot cavity, being longer (20–30 nm) than the quantum well gain and excitonic peak wavelength. As a laser's pump current is increased, heating causes the Fabry-Perot wavelength to red-shift (0.6 Angstroms per degree Centigrade), whereas the quantum well absorption peak red shifts at 3 Angstroms per degree Centigrade. Therefore, the detectivity increases sharply with increasing pump current. This effect can be easily remedied by proper tailoring of the active and detector quantum wells (i.e., making their compositions slightly different so that the active region's wavelength lies in a wide flat portion of the detector quantum well's response).

Figure 7:
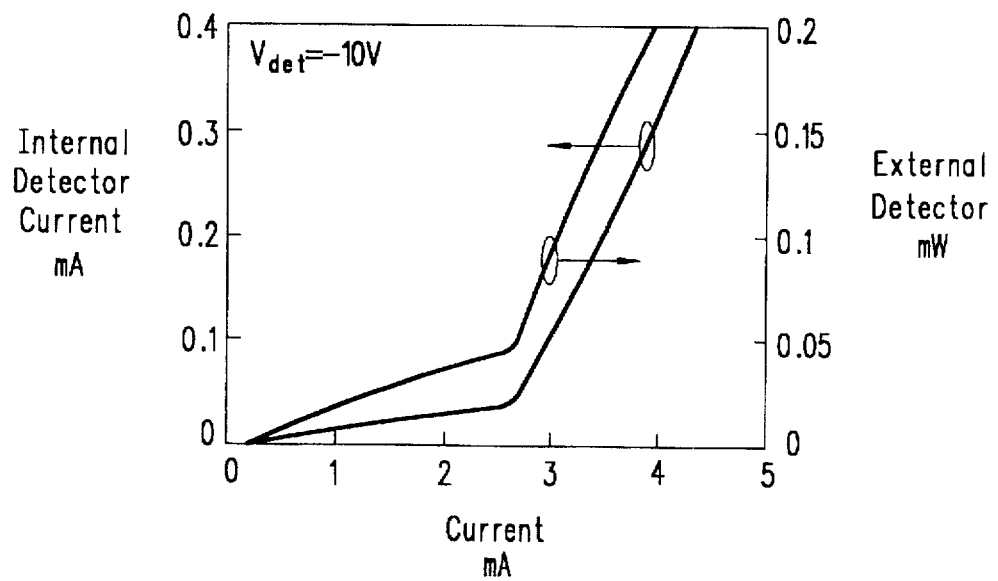
FIG. 7 illustrates minimal detected spontaneous emission for a top-emitting device constructed in accordance with an embodiment of the invention.
Figure 8:
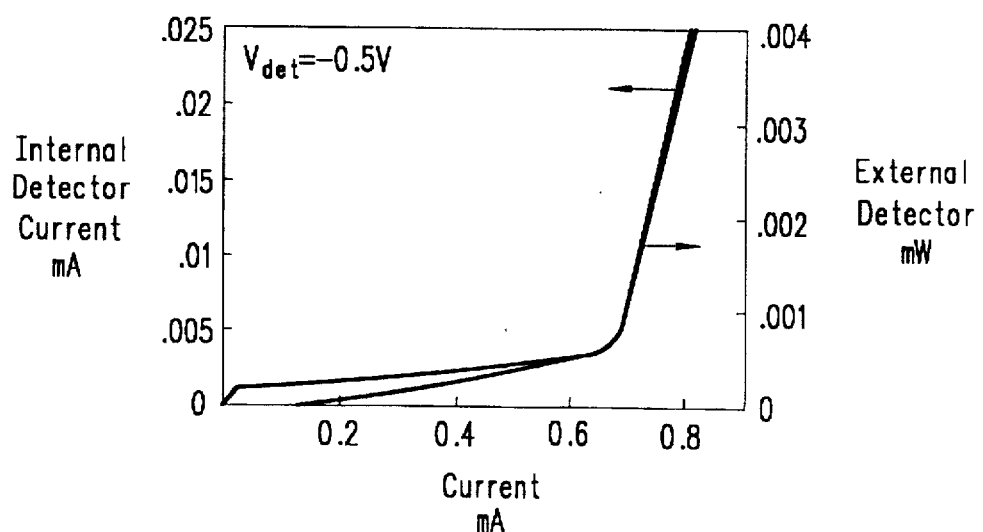
FIG. 8 illustrates minimal detected spontaneous emission for a bottom-emitting device constructed in accordance with an embodiment of the invention.

FIG. 7 illustrates minimal detected spontaneous emission for a top-emitting device, while FIG. 8 illustrates minimal detected spontaneous emission for a bottom-emitting device. These figures actually magnify the behavior of the L-I curves from previous figures so that one can more clearly observe the spontaneous emission. For both bottom- and top-emitting structures, the amount of spontaneous emission detected by the internal detector is as low as (in the bottom-emitting case) and even lower (in the top-emitting case) than an external detector. This effect is due to the fact that the quantum well is placed at a resonant position to detect only the Fabry-Perot wavelength and hence is not as sensitive as bulk material to the broadband nature of spontaneous emission.

Figure 9:
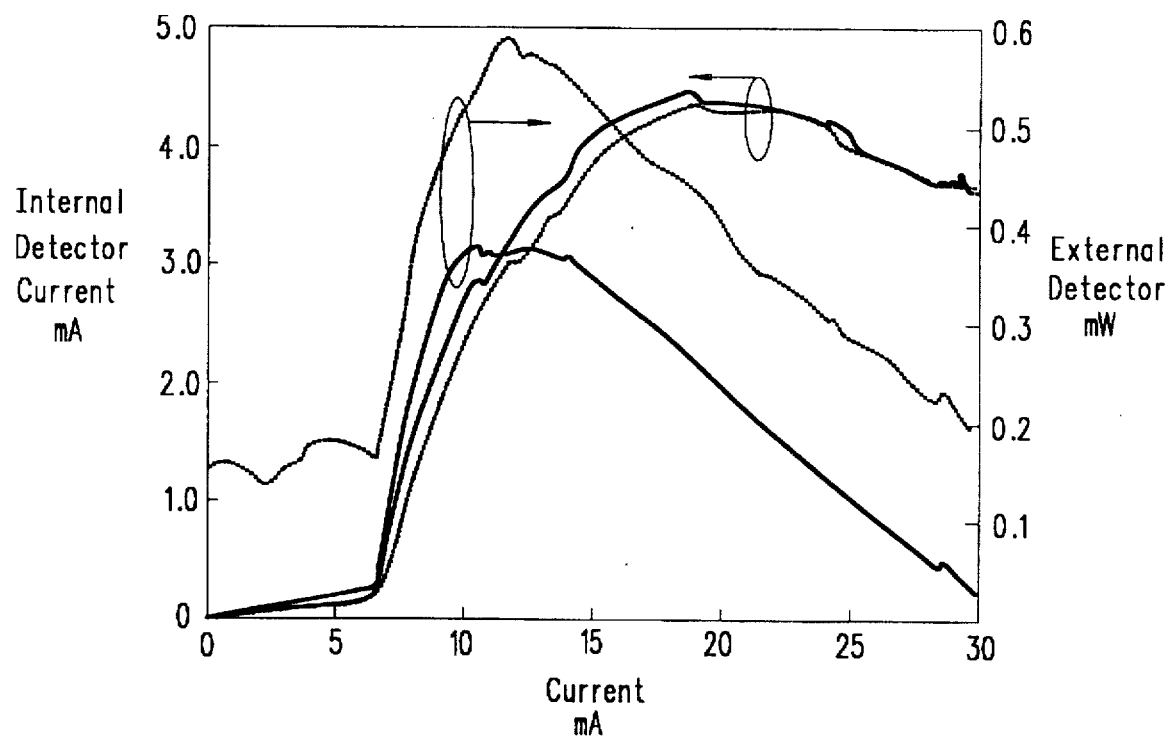
FIG. 9 illustrates that a device in accordance with the invention is much less sensitive to external light than an external photodetector.

FIG. 9 illustrates the response of a top-emitting device to external light. In particular, the figure shows how insensitive the device is to external light. The solid lines represent the internal and external detectors without any external light applied to an experimental measurement setup. The dotted lines show the responses when external light is shone onto the setup. The external detector response shows a large jump, while the internal detector is virtually unaffected.

Figure 10:
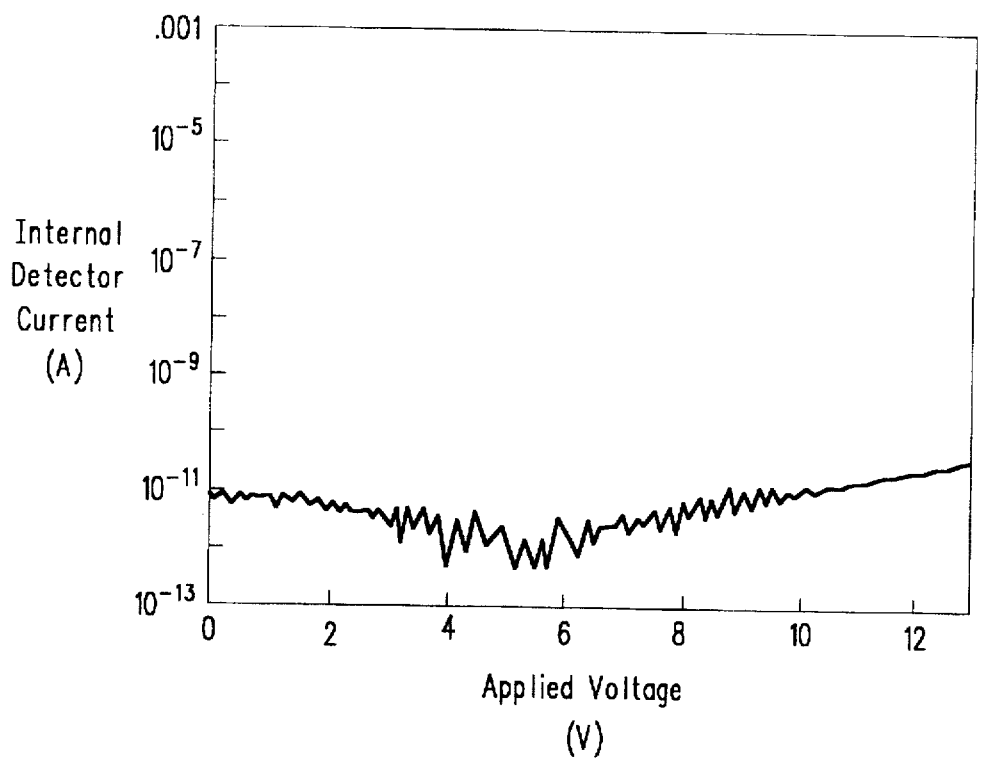
FIG. 10 illustrates the dark current associated with a device constructed in accordance with an embodiment of the invention.

FIG. 10 illustrates the dark current characteristics of the device of the invention. The dark current is the amount of current that the detector exhibits when there is no light or signal for it to detect. The lower the dark current, the more sensitive the detector is to any signal. The device of the invention demonstrates pA (picoAmperes) of dark current, which is as low as any commercially available detector. In fact, the measurements have been limited by the measuring instrument's noise floor so that the true dark current may be even lower.

Figure 11:
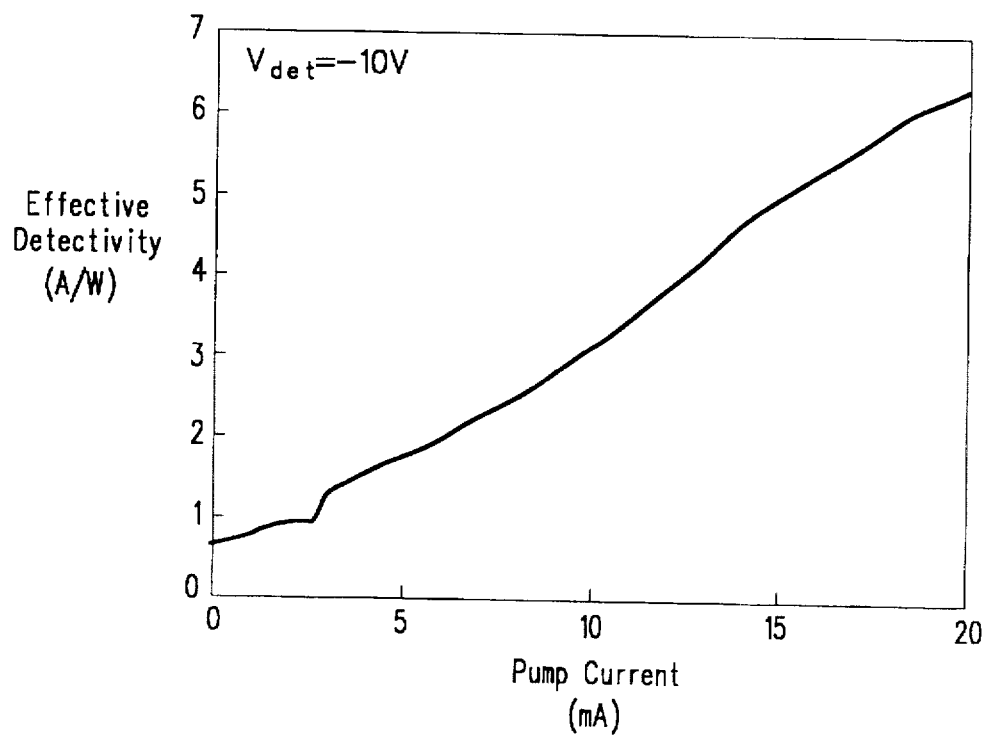
FIG. 11 illustrates the effective detectivity of the laser pump current for a device constructed in accordance with the invention.

FIG. 11 illustrates the internal effective detectivity of a device of the invention. The figure shows the effective detectivity as a function of the laser pump current. The effective detectivity is at least 1A/W around the threshold. This high responsivity results from tailoring the detector quantum well's overlap with a peak of the intensity field distribution within the lasing cavity. The detectivity's increase with pump current is a result of the lasing wavelength shifting through the detector's excitonic peak.

Figure 12:
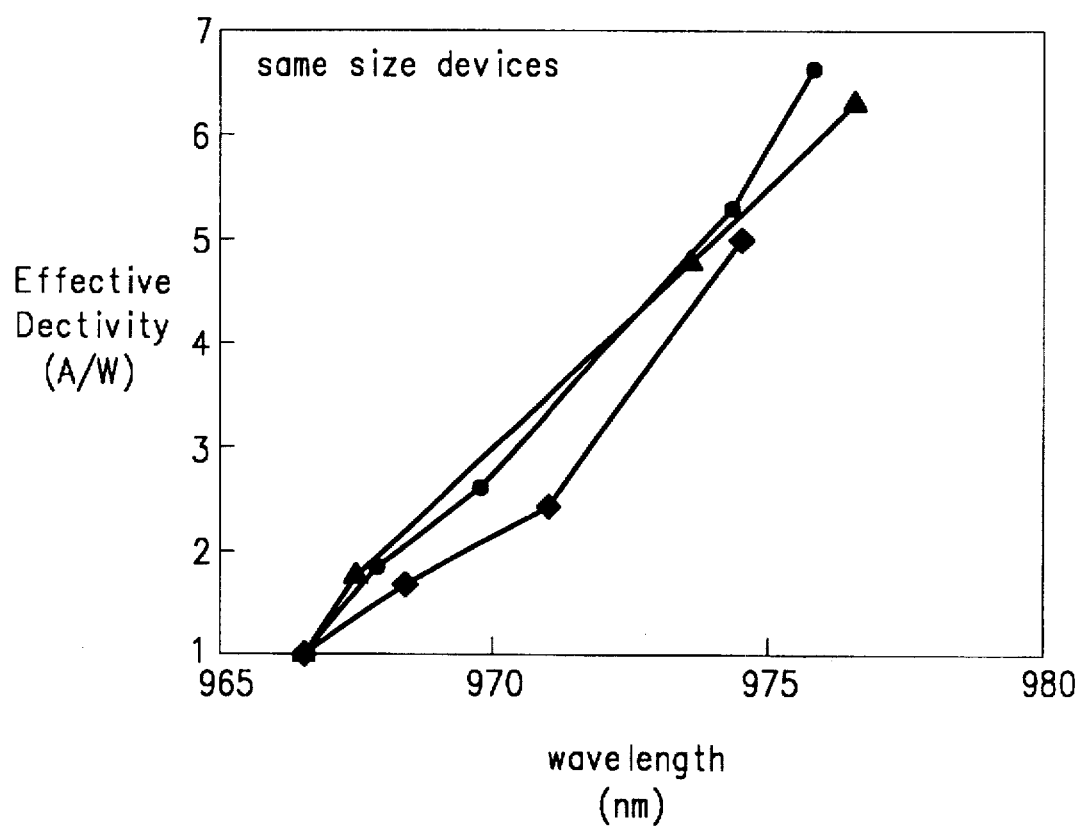
FIG. 12 illustrates the effective detectivity of three devices constructed in accordance with the invention, showing increased detectivity with increasing wavelengths.

FIG. 12 is a plot of the internal effective detectivity versus wavelength. This figure compares three devices of the same size and characteristics. The effective detectivity rises with increasingly longer wavelengths, bearing out the explanation of the excitonic enhancement due to the detector quantum well.

Figure 13:
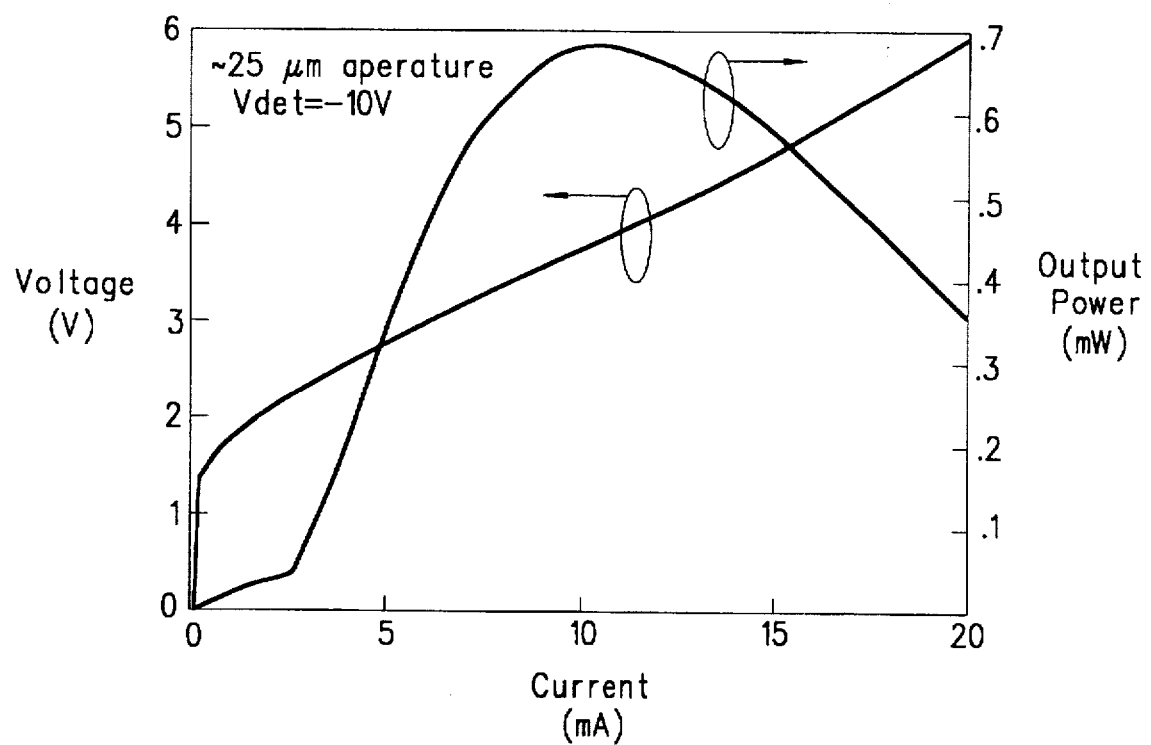
FIG. 13 illustrates the voltage behavior of a device in accordance with an embodiment of the invention.

FIG. 13 illustrates Current-Voltage (I–V) Characteristics of a device of the invention. The figure shows a device threshold voltage of 2.2V.

Figure 14:
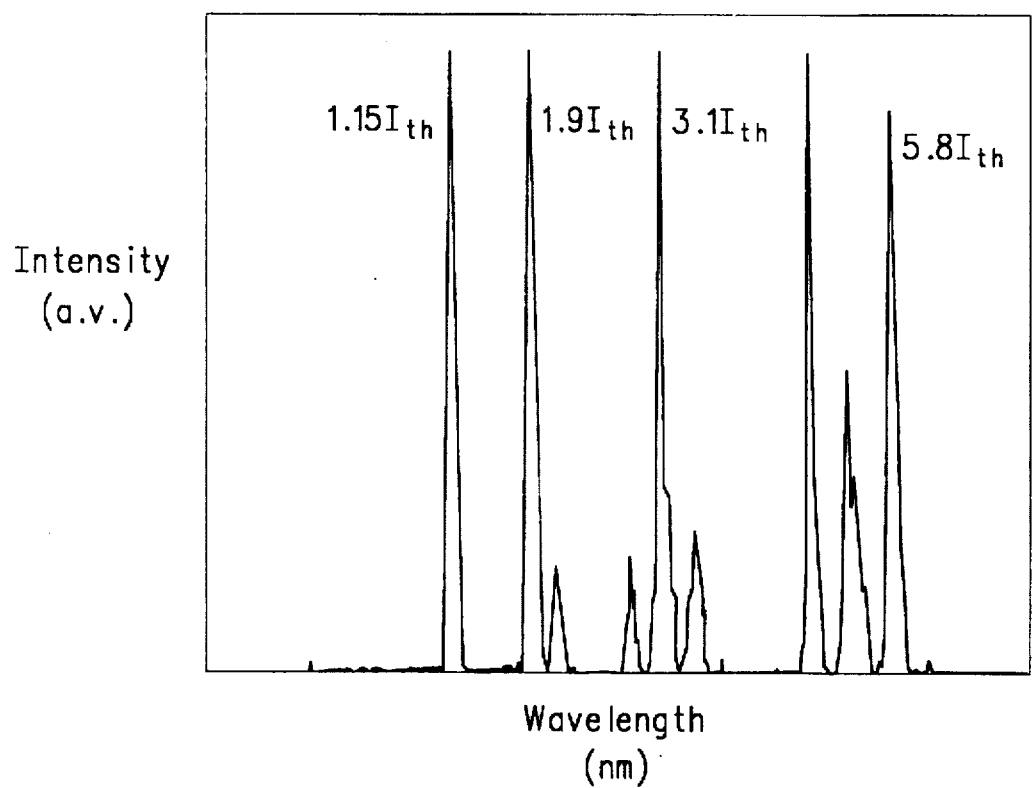
FIG. 14 illustrates the output spectra of a top-emitting device in accordance with an embodiment of the invention.

FIG. 14 illustrates the spectra of a top-emitting device in accordance with the invention. The output spectra of a device is tailored for specific applications. The device of this example was designed to lase at 980 nm. The actual wavelength produced is around 966 nm, as shown in the plot. The device starts out single-mode (no side lobes due to transverse modes) and becomes multi-mode at longer wavelengths with increasing pump current.

The invention has now been fully described. Attention presently turns to a discussion of the benefits associated with the invention, followed by a discussion of alternate embodiments in accordance with the invention.

A primary benefit of the invention is that it avoids bulky external detectors and accompanying optics. Another primary benefit of the invention is that its performance is superior to that of other monolithic sensors that are positioned on the top, bottom, or side of a VCSEL. Advantageously, the embedded nature of the quantum-well photodetector 50 between the p-doped DBR mirror stack 36 and the n-doped DBR mirror stack 60 renders the photodetector highly insensitive to spontaneous emission and ambient light. This is in contrast to existing prior monolithic devices where the photodetector is essentially an external detector. The quantum well, with its embedded position, prevents stray light from interfering with the power detection and monitoring, while its thin active region minimizes dark current.

Advantageously, the device uses a quantum well as the detecting or absorbing medium, instead of a bulk material. This, coupled with its intracavity location, allows the quantum well to operate at a peak of the intensity distribution inside the lasing cavity so that it can sample a large quantity of light and hence be highly responsive. The invention also exploits the fact that the quantum well is resonant at the Fabry-Perot wavelength of the VCSEL.

The intracavity resonant quantum well photodetector of the invention achieves very high effective responsivity, on the order of 1A/W (Ampere/Watt). Ordinary external silicon photodetectors have about 0.6 A/W responsivity.

The photodetector detects virtually no spontaneous emission. This is important since it is desirable to modulate near threshold, and the spontaneous emission would decrease the on-off ratio necessary for a clean signal. Also, the minimal detection of spontaneous emission leads to a very clear output light-current (L-I) curve necessary for determining the threshold current with accuracy. Prior art devices commonly correct their L-I curves by subtracting the spontaneous emission.

A variety of alternate embodiments of the invention may be constructed. For instance, quantum well design parameters such as quantum well thickness and energy depth, quantum well location within the structure, and the number of quantum wells may be varied. In addition, the active and photodetector quantum wells may be of different compositions to control the excitonic enhancement and bias behavior.

Wet-etching processes were described, but dry-etching through reactive ion etching or ion-milling may also be used. In addition, other material systems, such as GaAs, InGaP, and InGaAsP for laser output in a variety of wavelengths may be used. A variety of substrates may also be used with different material systems.

The wafer may be grown on a semi-insulating substrate to reduce absorption.

In the alternative, the wafer may be grown on a p+ substrate for compatibility with integrated circuit drivers. An air bridge contact between the contacts of the device and larger contact pads may be used. A structure illustrating this concept is shown in FIG. 15.

Figure 15:
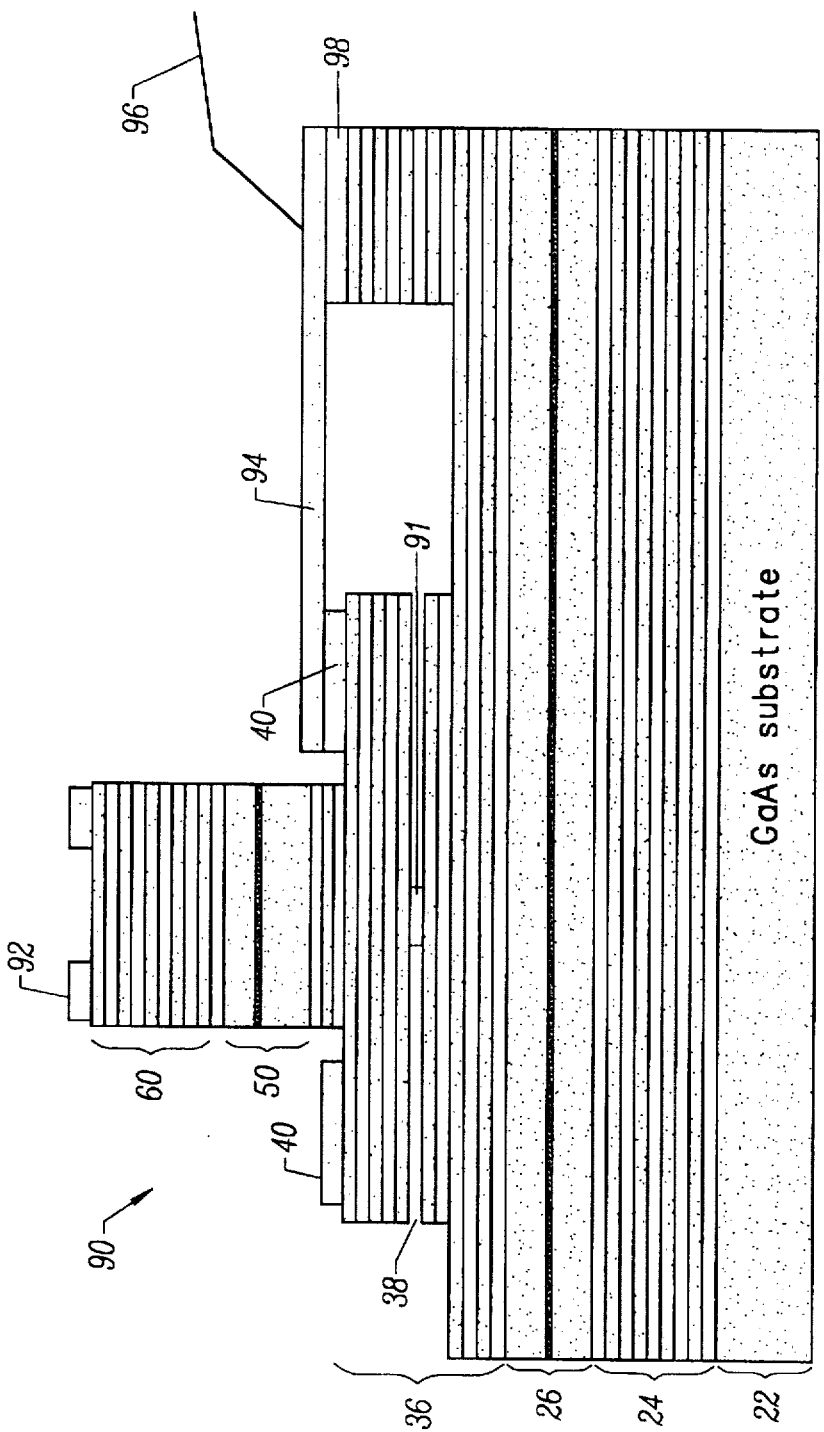
FIG. 15 illustrates an air bridge contact structure in accordance with an embodiment of the invention.

The device 90 of FIG. 15 generally corresponds to the device 20 of FIG. 1. In particular, the device 90 includes, a GaAs substrate 22, an N-doped DBR mirror stack 24, an active gain region 26, and a p-doped DBR mirror stack 36. In the embodiment of FIG. 15, the confinement layer 38 is in the form of an air gap. A spacer 91 is used as a current channel and for structural support, but the remaining region in the plane of the spacer 91 is air.

The device 90 also includes a quantum well detector 50 and an n-doped mirror 10 stack 60. The contact 92 on top of the n-doped mirror stack 60 is annular, thereby allowing light to exit through its aperture. Thus, the device of FIG. 15 is a top-emitting device.

FIG. 15 also illustrates an air bridge 94 extending from the p-contact 40. The distal end of the air bridge 94 may be contacted with a probe 96. An insulating layer 98, such as silicon nitride, is used for insulation so that the pump current does not go directly down into the device 90. The air bridge 94 is used to extend the p-contact 40 since probe pressure directly above the air gap 38 would destroy the gap. In addition, this geometry enables the use of larger probe tips for ease of measurement. Naturally, this technique can be used if the air gap is replaced with oxidized AlAs or some other dielectric layer.

The device of the invention may be formed with a ridge waveguide geometry.

Figure 16:
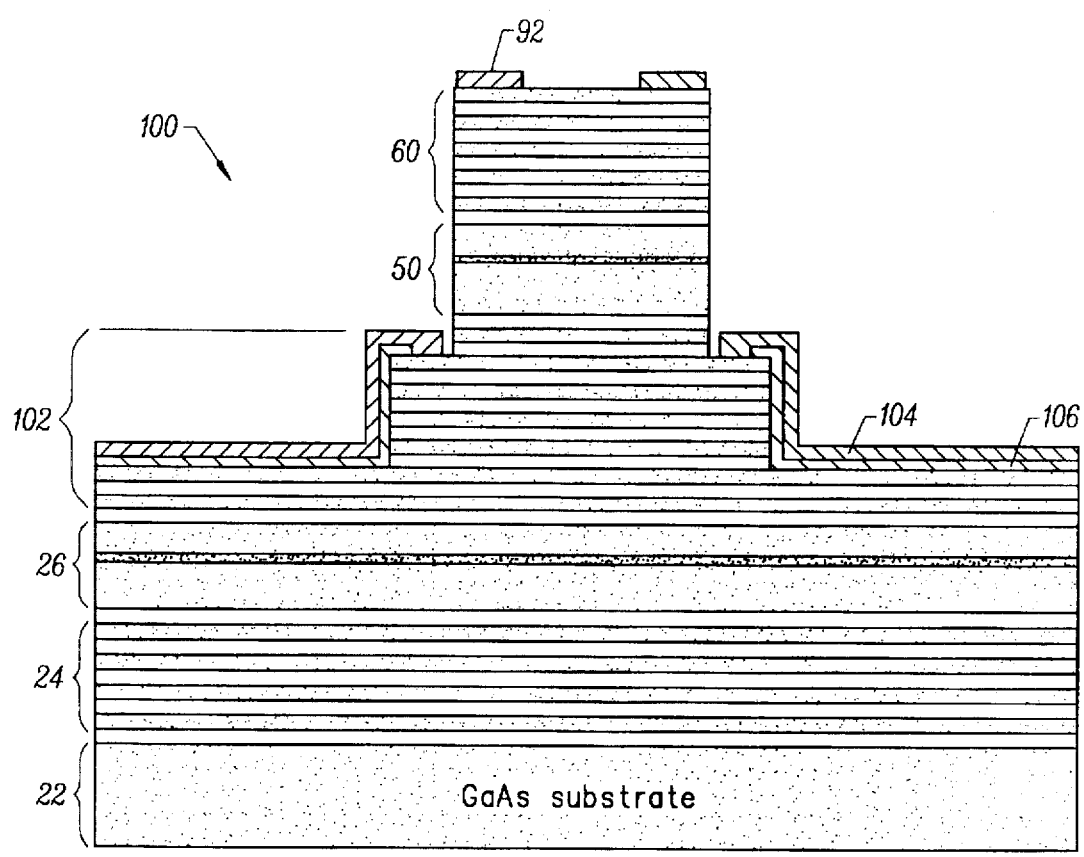
FIG. 16 illustrates a ridge waveguide structure in accordance with an embodiment of the invention.

FIG. 16 illustrates such a device. The device 100 of FIG. 16 generally corresponds with the device 20 of FIG. 1. In particular, the device 100 includes, a GaAs substrate 22, an N-doped DBR mirror stack 24, and an active gain region 26. However, unlike the device of FIG. 1, a ridge waveguide geometry exists in a p-doped DBR mirror stack 102. The p-contact 104 is formed on a dielectric layer 106. The dielectric layer 106 is used to define a path for the current since the charged carriers cannot penetrate the insulating dielectric.

The device 100 also includes a quantum well detector 50 and an n-doped mirror stack 60. The annular contact 92 indicates that the device 100 is a top-emitting device.

Figure 17:
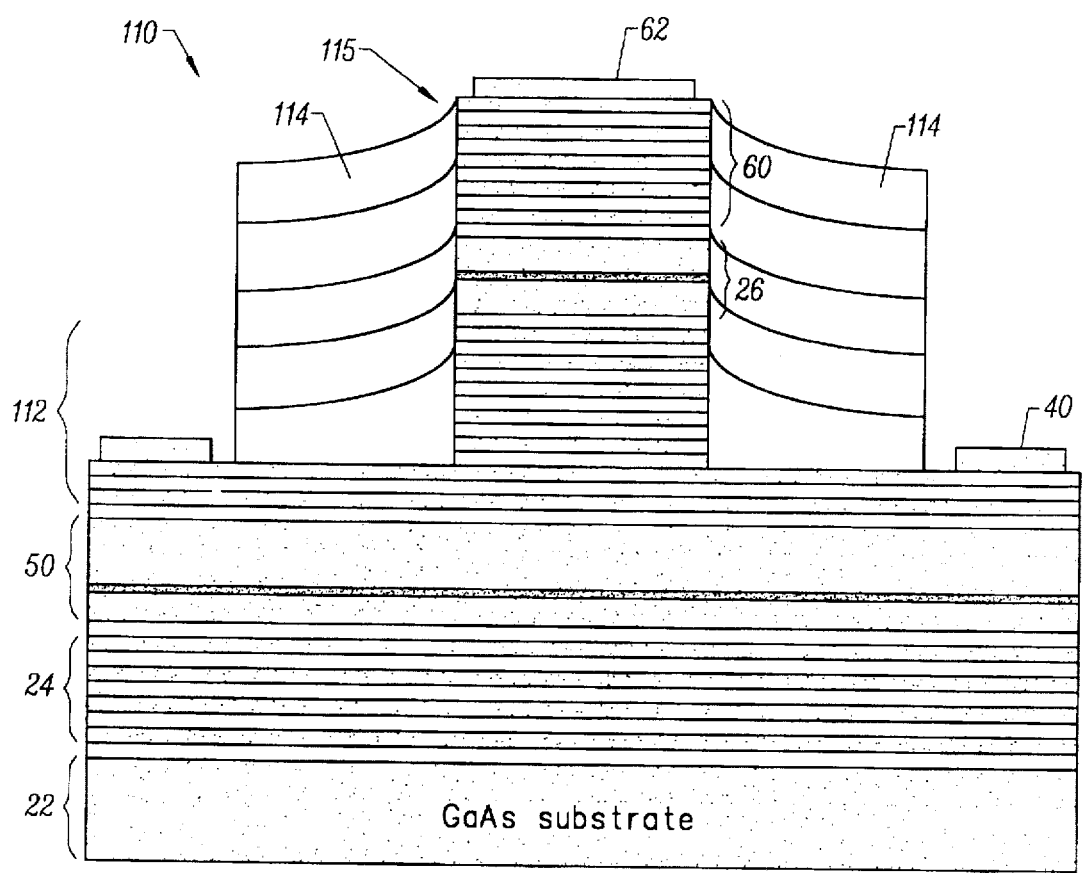
FIG. 17 illustrates buried heterostructure layers in accordance with an embodiment of the invention.

The invention may also be implemented in a buried heterostructure design. Such a structure is illustrated in FIG. 17. The device 110 of FIG. 17 includes a GaAs substrate 22 with an n-doped DBR mirror stack 24 positioned on it. In this embodiment of the invention, the quantum well detector 50 is positioned on top of the n-doped DBR mirror stack 24. A p-doped DBR mirror stack 112 is positioned on top of the quantum well detector 50. The active region 26 is positioned on top of the p-doped DBR mirror stack 112. An n-doped DBR mirror stack 60 is positioned on top of the active region 26, and an N-contact 62 is provided on top of the device 110. Regrown buried heterostructure (BH) layers 114 are grown onto the device after the pillar 115 has been etched down. These BH layers 114 provide index-guiding for the light as well as some current confinement.

Figure 18:
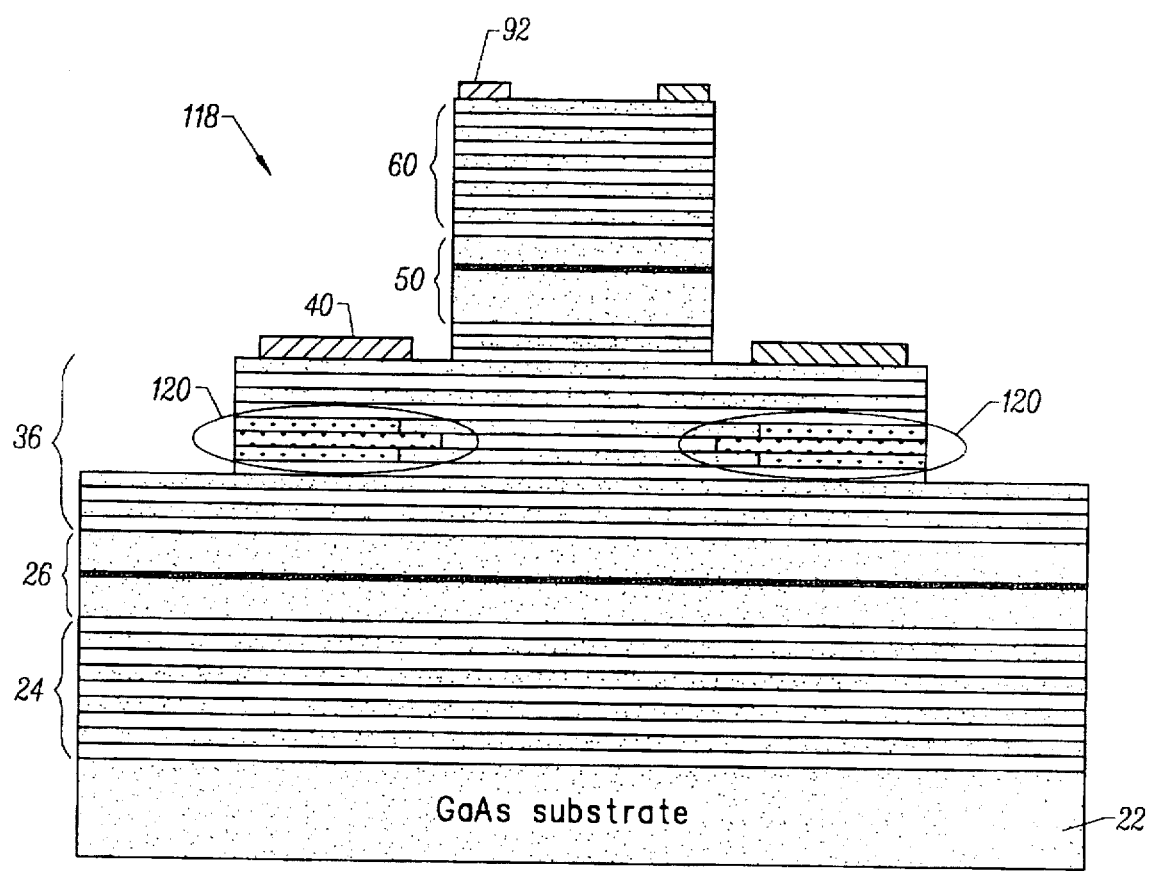
FIG. 18 illustrates a proton implantation current confinement structure in accordance with an embodiment of the invention.

FIG. 18 illustrates a device with current confinement through proton implantation. The device 118 generally corresponds to the device of FIG. 1. However, the current confinement in the device of FIG. 18 is achieved by proton implantations 120. In particular, the figure illustrates a proton (H+) implanted structure 120, which serves to confine current. This proton implant can be achieved through shadow-masking (i.e., putting an appropriate mask on the sample, tilting the whole sample or substrate relative to the proton beam so that at certain energies the protons penetrate down to the desired layers and leave the top layers undamaged).

The device of the invention may be operated as a self-pulsating VCSEL by using the absorber quantum well as a saturable absorber. This requires a quantum well design such that the optical absorption is reduced or saturated with increasing optical intensity. Typically, this can be achieved with a design such that the quantum well excitonic wavelength is well matched with the VCSEL F-P wavelength. The device may also be operated as an AM or FM modulated VCSEL through modulation of the absorber quantum well.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

We claim:

1. A diode laser, comprising:

a contact to receive a control signal;

a sandwich of distributed Bragg reflector mirror stacks responding to said control signal to produce excess charge carriers, each distributed Bragg reflector mirror stack of said sandwich of distributed Bragg reflector mirror stacks having an alternate doping with respect to an adjacent distributed Bragg reflector mirror stack of said sandwich;

an active gain region positioned within said sandwich, said active gain region receiving said excess charge carriers to produce emitted light; and a quantum well photodetector positioned within said sandwich to monitor said emitted light.

2. The apparatus of claim 1 wherein said sandwich is positioned on a substrate.

3. The apparatus of claim 2 wherein said substrate is gallium arsenide.

4. The apparatus of claim 2 wherein said substrate is semi-insulating.

5. The apparatus of claim 2 wherein said substrate has n+ doping.

6. The apparatus of claim 2 wherein said substrate has p+ doping for compatibility with integrated circuit drivers.

7. The apparatus of claim 1 wherein said sandwich includes a first n-doped distributed Bragg reflector mirror stack.

8. The apparatus of claim 7 wherein said active gain region is positioned on said first n-doped distributed Bragg reflector mirror stack.

9. The apparatus of claim 8 wherein said active gain region includes a one-wavelength spacer with a quantum well stack positioned therein.

10. The apparatus of claim 7 wherein said sandwich includes a p-doped distributed Bragg reflector mirror stack positioned on said active gain region.

11. The apparatus of claim 10 wherein said p-doped distributed Bragg reflector mirror stack includes a current confinement layer.

12. The apparatus of claim 1 1 wherein said current confinement layer includes an oxidation layer.

13. The apparatus of claim 12 wherein said current confinement layer is an air gap.

14. The apparatus of claim 12 wherein said current confinement layer is formed by proton implantation.

15. The apparatus of claim 10 wherein said quantum well photodetector is positioned on said p-doped distributed Bragg reflector mirror stack.

16. The apparatus of claim 15 wherein a second n-doped distributed Bragg reflector mirror stack is positioned on said quantum well photodetector.

17. The apparatus of claim 1 wherein said quantum well photodetector includes a spacer with a quantum well formed therein, wherein said quantum well photodetector is positioned at an optical intensity peak at the Fabry-Perot wavelength of said diode laser.

18. The apparatus of claim 1 further comprising an air bridge structure between two contacts.

19. The apparatus of claim 1 further comprising a ridge waveguide structure.

20. The apparatus of claim 1 further comprising buried heterostructure layers.

21. A method of operating a diode laser, said method comprising the steps of:

receiving a control signal;

generating laser emissions in a sandwich of distributed Bragg reflector mirror stacks in response to said control signal, each distributed Bragg reflector mirror stack of said sandwich of distributed Bragg reflector mirror stacks having an alternate doping with respect to an adjacent distributed Bragg reflector mirror stack of said sandwich; and monitoring said laser emissions with a quantum well photodetector positioned within said sandwich.

22. The method of claim 21 further comprising the step of using an absorber quantum well positioned in said sandwich as a saturable absorber.

23. The method of claim 21 further comprising the step of modulating an absorber quantum well positioned in said sandwich.

* * * * *